United States Patent [19]

Yu et al.

[11] Patent Number: 5,631,197
[45] Date of Patent: May 20, 1997

[54] SACRIFICIAL ETCHBACK LAYER FOR IMPROVED SPIN-ON-GLASS PLANARIZATION

[75] Inventors: Chen-Hua Yu, Keelung; Syun-Ming Jang, Hsin-Chu; Lung Chen, Hsin-Chu; Yuan-Chang Huang, Hsin-Chu, all of Taiwan

[73] Assignee: Taiwan Semiconductor Manufacturing Company, Ltd, Hsinchu, Taiwan

[21] Appl. No.: 520,595

[22] Filed: Aug. 30, 1995

[51] Int. Cl.⁶ ............................................. H01L 21/465
[52] U.S. Cl. .................... 438/699; 216/38; 438/723
[58] Field of Search .................... 156/657.1; 216/38, 216/72; 437/228, 231, 238, 978

[56] References Cited

U.S. PATENT DOCUMENTS

| | | | |
|---|---|---|---|
| 5,021,121 | 6/1991 | Groechel et al. | 156/657.1 |
| 5,212,116 | 5/1993 | Yu | 437/228 |
| 5,242,538 | 9/1993 | Hamrah et al. | 216/79 |
| 5,250,472 | 10/1993 | Chen et al. | 437/231 |
| 5,254,497 | 10/1993 | Liu | 437/978 |
| 5,294,294 | 3/1994 | Namose | 156/643.1 |
| 5,435,888 | 7/1995 | Kalnitsky et al. | 437/231 |

OTHER PUBLICATIONS

Mukherjee, S.D., ed. Proceedings of the SPIE Advanced Processing of Semiconductor Devices vol. 797 pp. 49-60 Mar. 1987.

*Primary Examiner*—Robert Kunemund
*Assistant Examiner*—Anita Alanko
*Attorney, Agent, or Firm*—George O. Saile; William J. Stoffel

[57] ABSTRACT

A method for forming a sacrificial planarization layer over an SOG layer which provide a more planar final surface. A substrate is provided with a first insulating layer formed on its surface. A spin-on-glass (SOG) layer is formed over the first insulating layer. The SOG layer has a greater thickness towards the outer edge compared to the central area of the substrate. Next a sacrificial layer is formed over the SOG layer. The sacrificial layer, preferably formed of silicon oxide material, is formed so that the layer has a greater thickness towards the outside of the wafer than in the central area. Next, the sacrificial layer is etched away and portions of the SOG layer are etched. The etch rates of the sacrificial layer, the SOG layer and the first insulating layer are approximately equal so that the planar top SOG surface is transferred to the final top surface after the etch. The resulting surface is planar because the additional sacrificial layer thickness in the outside periphery compensated for the thinner SOG in on the periphery and the faster etch rate on the periphery.

34 Claims, 2 Drawing Sheets

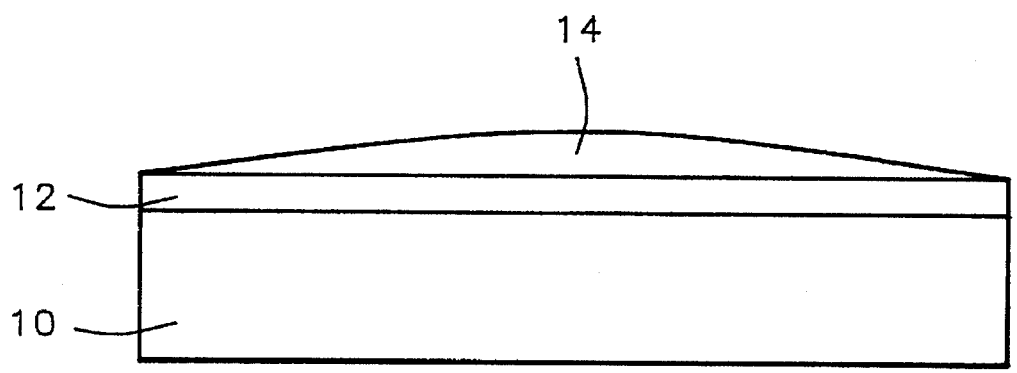
FIG. 1 - Prior Art
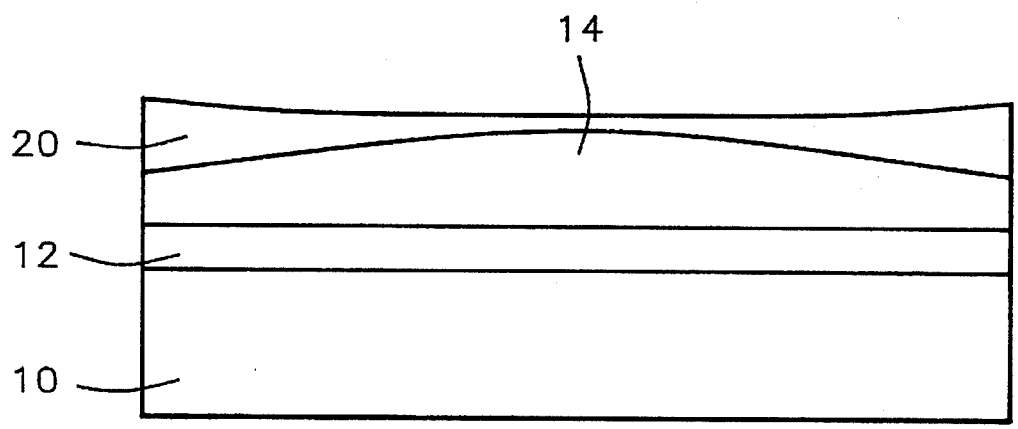
FIG. 2
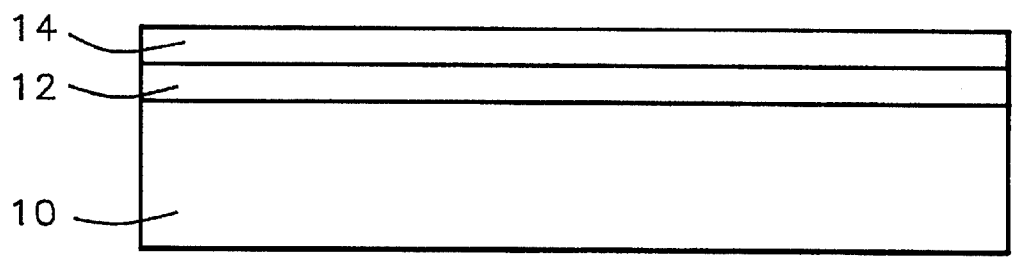
FIG. 3

SACRIFICIAL ETCHBACK LAYER FOR IMPROVED SPIN-ON-GLASS PLANARIZATION

BACKGROUND OF INVENTION

1. Field of the Invention

The present invention relates to a method for manufacturing a semiconductor device, and more particularly to a method for planarizing an insulating interlayer to be used in conjunction with other multilevel interconnect technology.

2. Description of the Prior Art

To manufacture an integrated circuit, it is necessary to form many active devices on a single substrate. Initially, each of the devices must be isolated from the others, but recently it has become necessary to electrically interconnect specific devices during the fabrication step to obtain the desired functionality of the circuit. Both MOS and bipolar devices have multilevel interconnect structures to accommodate the numerous interconnections of the devices.

As the number of layers in an interconnect structure increase, the topography of the top layer coated on the semiconductor wafer becomes more rugged. For example, in manufacturing a semiconductor wafer having two or more metal layers formed thereon, a first insulating interlayer is coated on the wafer on which a plurality of oxide layers, polycrystalline silicon conductive layers, and a first metal wiring layer, have been previously formed, followed by forming vias for interposing a second metal layer. The surface of the first insulating layer is uneven because the underlying structure upon which the first insulating layer has been formed is uneven. When a second metal layer is directly formed over such a first insulating interlayer, the second metal layer fractures due to peaks and/or cracks in the first insulating intedayer and as a result the metal coverage over the first insulating interlayer fails. This failure lowers the yield of the semiconductor device. Therefore, planarization of the insulating interlayer is required for multilevel metal interconnections, before forming a via or coating a second metal layer.

One method available for planarizing the semiconductor wafer is to form a first conformal silicon oxide layer over the underlying irregular structures. Next, a planarizing spin-on-glass (SOG) layer is formed over the first silicon oxide layer. The SOG layer is then baked and cured. The SOG layer is etched back to remove most or all of the SOG layer and a portion of the first oxide layer. This etch back step is used to transfer the planar SOG top surface shape to the first oxide surface. The etch of the SOG layer and the silicon oxide layer is controlled so that they both etch at about the same rate. Next, a second silicon oxide layer can be formed over the first silicon oxide layer. Many variations on this SOG etch back method exist.

However, the current planarization processes do not provide an uniform planar surface which results in an oxide thickness variation across a wafer and a surface with peaks and valleys. The non-planar surface is caused by at least two problems. First, the etchback rate of the SOG is faster near the edge of the wafer compared to the center of the wafer. This causes more of the SOG and first oxide layer to be etched back more at the edges of the wafer than the center area. The end result is that the resulting surface is lower (thinner) at the outside areas compared to the center areas. This non-uniformity may lead to several problems, such as tungsten residue and metal bridging for the next overlying metal layer.

Second, the spinning process used to form the SOG layer normally deposits the SOG layer thicker in the wafer center than near the wafer edge. As shown in FIG. 1, first insulating layer 12 and a SOG layer 14 are formed over a substrate 10. This convex shaped SOG layer 14 is created by the spin on process where centripetal forces cause the SOG layer to thin the further from the wafer center. See FIG. 1. Next, the SOG layer 14 and the first insulating layer 12 are etched back. Because of the thinner SOG layer in the periphery, the underlying silicon oxide layer 12 is etched back more and is thinner in the peripheral areas. For example, for an etch back of a 6000 Å SOG layer 14 and a 1500 Å etch into an underlying silicon oxide layer 12, the typical silicon oxide layer thickness difference between the center and the periphery caused by the non-uniform etch back and SOG spin will be between 1500 to 2000 Å.

The combination of the two problems, the faster SOG etch rate on the periphery of the wafer and the thinner SOG layer on the periphery of the wafer, creates a non-uniform and non-planar surface. The underlying silicon oxide layer is thinner in the peripheral areas. This non-planar surface can cause tungsten residue problems. Tungsten residue from subsequent metal processes can remain in the valleys on the non-planar surface and cause shorting between metal lines thus reducing chip yields.

U.S. Pat. No. 4,676,867, to Elkins and U.S. Pat. No. 4,986,878 to Malazgirt, describe SOG etchback processes, but do not adequately improve the SOG etchback uniformity. Elkin teaches a process of applying a first direction layer over a first metal layer, applying a spin-on-glass layer over the first dielectric layer, etching the spin-on-glass layer to reveal parts of the first dielectric layers. A second dielectric layer is formed over the first dielectric layer. However, this process does not address the problems of the non-uniform spin-on-glass layer and the non-uniform etch back.

Malazgrit teaches an etch back process where a dialectic layer is formed over a structure, a spin-on-glass layer is applied over the dialectic layer, the spin-on-glass layer and portions of the dialectic layer are etched away, the remaining spin-on-glass layer is removed with an etch, and a passivation layer is applied over the remaining dielectric layer. However, further improvement is required to overcome the problems of the uneven SOG layer and etch back.

Therefore, it is desirable to develop a SOG etch back process that provides improved etch back uniformity and improved planar resulting surface.

SUMMARY OF THE INVENTION

It is an object of the present invention to provide a method of planarization that provides a more uniform and more planar resulting surface.

It is another object of the present invention to provide an improved method of planarization of a layer which has a thickness gradient from the center of the wafer to the peripheral areas.

It is another object of the present invention to provide a method of etching back SOG layers using a sacrificial layer that compensates for the faster SOG etch rate on the periphery, the thinner SOG layer on the periphery and that provides a more level planar resulting surface.

According to the present invention, a method for planarizing a SOG layer which comprises the following steps. A first insulating layer can be formed on a substrate surface. A spin-on-glass (SOG) layer is formed over the first insulating layer. The SOG layer is thinner towards the peripheral areas compared to the central area of the substrate. Next, a sacrificial layer is formed over the SOG layer. The sacrificial layer, preferably formed of silicon dioxide material, is formed so that the layer has a greater thickness towards the outside of the wafer than the center of the wafer. Preferably, the sacrificial layer is composed of silicon dioxide formed in a plasma enhanced chemical vapor deposition (PECVD) process so that the sacrificial layer in the outside area is thicker than the central area. The sacrificial layer can be formed with a thickness gradient across the wafer by varying the gas flows in a PECVD process so that the reactant gas flow rate is faster over the peripheral areas than over the central areas of the wafer. The thicker outside area of the sacrificial layer can be formed by increasing the reactant gasses flow rate around the periphery of the wafer. The sacrificial layer preferably has a thickness at least equal to the thickness difference from the center to the edge area of the spin-on-glass plus the thickness required to compensate for the faster SOG etch rate at the periphery of the wafer. The sacrificial layer 20 preferably has a thickness in the range of between about 2000 to 8000 Å.

Next, the sacrificial layer is etched away and portions of the SOG layer are etched. The etch rates of the sacrificial layer, the SOG layer, and the first insulating layer are approximately equal so that the planar top SOG surface is transferred to the resulting surface after the etch. The resulting surface is planar because the additional sacrificial layer thickness at the peripheral areas, compensated for, and was consumed by the faster etch rate on the edge and because the SOG layer was thinner on the periphery.

BRIEF DESCRIPTION OF THE DRAWING

The drawings show the following:

FIG. 1 is a cross-sectional view in broken section in greatly enlarged scale that shows the prior art process for forming and planarizing a spin-on glass layer.

FIGS. 2 through 4 are cross-sectional views in broken section in greatly enlarged scale that show the improved process of the present invention for planarizing a spin-on-glass layer.

FIG. 2 shows forming a sacrificial layer and a SOG layer over a first insulating layer.

FIG. 3 shows etching of the sacrificial layer and the SOG layer to form a planar surface.

FIG. 4 shows etching of the sacrificial layer and the SOG layer in which all of the SOG layer is removed to form a planar surface.

DETAILED DESCRIPTION OF THE PREFERRED EMBODIMENTS

Figure 4:
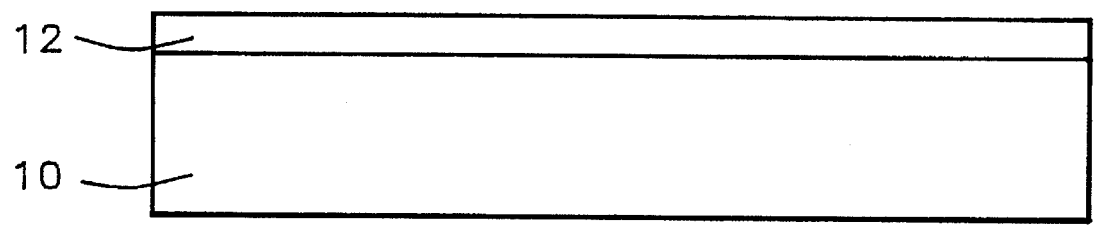

The present invention will be described in detail with reference to the accompanying drawings. It should be noted that the drawings are in greatly simplified form. In practice, the semiconductor substrate will have many device structures formed within and thereon and the devices can be connected with suitable metallurgy in various electronic electric circuit configurations.

A semiconductor substrate 10 is provided and preferably has an annular shape and has an outer peripheral area and a central area. Next, semiconductor structures, such as gates, conductive lines, and trenches, can be formed in and on the substrate. (not shown) The structures can create an uneven topology.

A first insulating layer 12 can then be formed on the substrate surface. The first insulating layer 12 can be formed over the devices formed on the substrate and acts as an additional layer to prevent the SOG layer from contacting the underlying devices and conductive layers. The first insulating layer 12 is preferably formed of silicon oxide and can have a thickness in the range of about 1000 to 3000 Å and a thickness more preferably of about 2000 Å.

A first spin-on-glass (SOG) layer 14 is formed over the substrate and other overlying layers. The first SOG layer 14 can be formed of a common SOG material, such as silicate or siloxane material. The SOG layer 14 is preferably formed of Allied Signal's organic siloxane, SOG No. 314, from Allied Signal Corp., 3500 Garret Dr., Santa Clara Calif. 95054-2827.

The first SOG layer 14 can have a thickness in the range of about 3000 to 8000 Å and more preferably a thickness of about 6000 Å. The first SOG layer can also be formed as a series of more than one SOG layer coatings. The first SOG layer is normally formed so that the SOG thickness in the center of the substrate is greater than the thickness on the periphery. This thickness variation is caused by the spin on operation. The centripetal forces of the spin operation thin the SOG layer on the periphery. This thickness variation can be 0.5 to 5% of the total SOG layer thickness.

The first spin-on-glass layer is preferably baked and/or cured prior to the etch. Any conventional bake and cure process can be used that is compatible with the chosen SOG layer. For example, the SOG layer can be baked at a temperature in the range of about 150° to 200° C. and cured at a temperature in the range of about 400° to 450° C. for up to one hour in an ambient atmosphere of air or a mixture of oxygen and nitrogen. In another embodiment of the present invention, the SOG layer 14 is a dielectric layer such as silicon oxide or silicon nitride.

Next, a sacrificial layer 20 is formed over the SOG layer 14 as shown in FIG. 2. The sacrificial layer 20 has a greater thickness on the outside periphery of the wafer than in the central area to compensate for the thinner SOG thickness in on the periphery and to compensate for the faster SOG etch back rate on the peripheral area. The sacrificial layer 20 preferably has a thickness in the thick peripheral area greater than the thickness difference in the SOG layer between the thinnest area (peripheral area) and the thickest area (central area). The sacrificial layer 20 preferably has a thickness gradient from the peripheral area to the central area. The thickness gradient is preferably greater than the thickness difference in the SOG layer between the thinnest area (e.g., peripheral area) and the thickest area (e.g., central area). The thicker sacrificial area overlies the thinner SOG layer area (e.g., the thick sacrificial peripheral area and the thin SOG peripheral area ). The sacrificial layer preferably has a sufficient thickness to fill in the low (thin) peripheral areas of the SOG layer so that the top surface of the sacrificial layer is level and planar. The sacrificial layer may be non-planar to compensate for the thickness of the layers 20, 14, 12 removed by the faster etch back. The sacrificial layer may be higher in the edges to compensate for a height etch rate in on the edges as shown in FIG. 2.

The total thickness of the sacrificial layer 20 and the SOG layer 14 is approximately equal in both the central area and the peripheral areas. Preferably, the total combined thickness of the SOG layer 14 and the sacrificial layer 20 is thicker in the peripheral area than the central areas to compensate for the higher etch in the peripheral area. For the sacrificial layer, the preferred thickness difference between the periphery and the center depends on, and is tailored to, the thickness difference in the SOG layer (center to periphery)

and the faster SOG etch rate on the edge. The sacrificial layer 20 preferably has an overall thickness in the range of between about 3000 to 8000 Å.

The sacrificial layer 20 can be formed of any insulating layer that can be formed with a thickness gradient from the center to periphery areas, with the periphery being thicker. Preferably, the sacrificial layer is formed of silicon oxide. The silicon oxide sacrificial layer can be formed by a plasma enhanced chemical vapor deposition (PECVD) process which can use Tetraethylorthosilicate (TEOS) or silane reactants. A silicon oxide can be formed by a conventional PECVD-silane process such as by reacting shane and nitrous oxide in an argon plasma at a temperature between about 400° to 450° C. A silicon oxide formed by a conventional PECVD-TEOS process can be deposited by decomposing tetraethoxysilane (TEOS). The sacrificial layer thickness in the periphery and the center can be controlled by varying the relative reactant gas flow rate so that the reactant gas flow rate is higher on the wafer periphery than in the center. The sacrificial layer can be formed using any conventional thermal and CVD process by varying the reactant flow rates from the periphery to the center.

In addition, if desired of other applications, the sacrificial layer 20 could be formed with a thinner periphery than center area by varying the gas flows and temperatures in the deposition process.

The sacrificial layer 20 and the first spin-on-glass layer 14 are then etched as shown in FIG. 3. All of the sacrificial layer 20 is removed and some or all of the SOG layer 14 can be removed. The etch process should be controlled so that the etch selectivity of SOG with respect to the sacrificial layer is approximately 1:1. Any conventional oxide etch can be used to etch back the sacrificial layer 20, the SOG layer and the first insulating layer 12. Preferably, a conventional reactive ion etch using $CHF_3$, $CH_4$ and $O_2$ gasses is used. The etch can be performed at about the following conditions: a flow of $CH_4$ in the range of about 15 to 40 sccm and a flow of $CHF_3$ in the range of about 50 to 100 sccm and a ratio of $CH_4$: $CHF_3$ between about 3:10 to 6:10, and an argon flow rate of between about 300 to 400 sccm and a rf power in the range of about 450 to 550 W and at a pressure in the range of 300 to 600 mTorr and at a cathode temperature of about 0° C. and a wafer temperature between about 25° to 70° C. during the etch process. The etch is more preferably performed at the following conditions: a $CH_4$ flow of about 15 sccm and a flow of $CHF_3$ of about 50 sccm and an argon flow rate of about 300 sccm and at a pressure of about 300 mTorr and a cathode temperature of about 0° C. and rf power of about 500 W. The etch is preferable performed in a LAM Research Co., Rainbow 4500 or 4520 series etcher.

In an embodiment of the present invention, the etch removes all of the sacrificial layer 20, and portions of the SOG layer 14 and underlying first insulation layer 12 thereby presenting a planar surface comprised of the remaining first insulating layer and the remaining SOG layer as shown in FIG. 3. Also, optionally, all of the SOG layer 14 can be etched away leaving only level planar portions of the first insulating layer 12. See FIG. 4.

Figure 5:
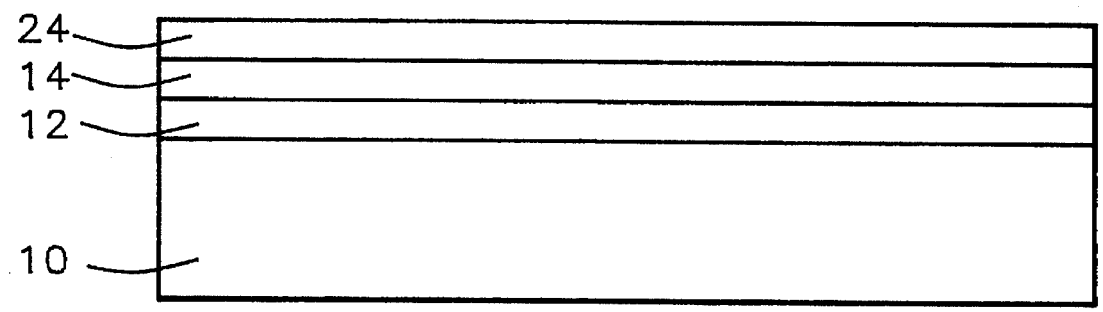
FIG. 5 shows forming a second insulating layer over the SOG layer that remains after etching.
Figure 6:
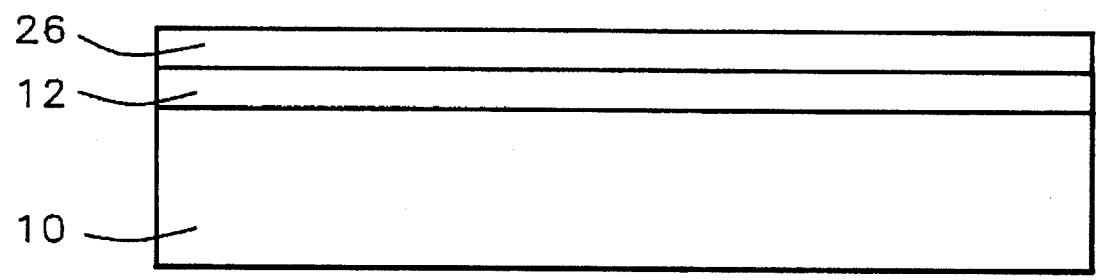
FIG. 6 shows forming a second insulating layer over the first insulating layer that remains after etching.

Afterward, other process variations are possible. For example, a second insulating layer 24 or 26 can be formed over the remaining SOG layer 14 or first insulating layer 12 as shown in FIGS. 5 and 6. Also, a second SOG layer could be formed over the SOG layer 14 and the first insulating layer 12. The process of the invention could be applied to this second SOG layer. The layers 24 and 26 can represent a combination of subsequent SOG and insulating layers, such as a combination of a second insulating layer, a second SOG layer and a third insulating layer. This invention can be applied to any SOG planarization step at any level in fabrication, such as the in the planarization of multiple levels of dielectric and conductor layers.

In another embodiment of the present invention, the sacrificial layer could be used as a planarizing technique for layers formed of any material (in addition to SOG) that has a thickness variation from the center area to the periphery area. Also, the thickness variations can have any non-uniformity (e.g. thick or thin on the edge or center of the wafer). The sacrificial layer could be formed thicker the periphery than the center, or vise versa. This can be done by varying the gas flows in the sacrificial layer deposition process. Therefore, any dielectric layers or similar layers could be substituted for the SOG layer.

This invention overcomes the major limitations in SOG etch back planarization due to the SOG thickness variations and etch rate variations across a wafer's diameter. The SOG spin on coating process causes the SOG layer to be thicker in the center area compare to the outside area. The sacrificial layer 20 compensates for the SOG layer thickness variations and etch back rate variations. The unique sacrificial layer 20 deposition process allows the sacrificial layer thickness to be tailored to the SOG thickness and etch variation.

While the invention has been particularly shown and described with reference to the preferred embodiments thereof, it will be understood by those skilled in the art that various changes in form and details may be made without departing from the spirit and scope of the invention.

What is claimed is:

1. The method of forming a planar surface by uniformly etching back a spin-on-glass (SOG) layer over a substrate comprising:

(a) forming a SOG layer over a substrate; said substrate having an annular shape with a central area and a peripheral area: said SOG layer having a greater thickness in said central area than in said peripheral area;

(b) forming a sacrificial layer over said SOG layer; said sacrificial layer having a greater thickness in said peripheral area of said substrate compared to said central area, and (c) etching back said sacrificial layer and portions of said SOG layer.

2. The method of claim 1 wherein said sacrificial layer is formed of silicon oxide formed by a chemical vapor deposition process where reactant gas is flowed over said substrate and controlling the gas velocity so that the reactant gas flow rate is greater over the periphery area than the central area.

3. The method of claim 1 wherein the SOG layer has a thickness in the range of about 3000 to 6000 Å.

4. The method of claim 1 wherein said spin-on-glass layer is formed by applying more than one spin-on-glass layer.

5. The method of claim 1 wherein said spin-on-glass layer is baked and cured before said sacrificial layer is formed.

6. The method of claim 1 wherein said spin-on-glass layer is composed of a material selected from the group consisting of silicate and siloxane.

7. The method of claim 1 wherein the sacrificial layer has a thickness in the range of about 3000 to 8000 Å.

8. The method of claim 1 wherein said sacrificial layer has a thickness in said peripheral area at least equal to the thickness difference between the thickest SOG area and the thinnest SOG area.

9. The method of claim 1 wherein the total thickness of said sacrificial layer and said SOG layer is approximately equal in both the central area and the peripheral areas.

10. The method of claim 1 wherein the sacrificial layer is formed of silicon oxide formed by a plasma enhanced chemical vapor deposition process by decomposing Tetra-ethoxysilane (TEOS).

11. The method of claim 1 wherein the sacrificial layer is formed of silicon oxide formed by a plasma enhanced chemical vapor deposition process using silane.

12. The method of claim 1 wherein the etching back of said SOG layer is performed with a trifluoromethane ($CHF_3$), methane ($CH_4$) and oxygen etch plasma chemistry.

13. The method of claim 1 wherein said etch back of SOG layer is performed at about the following conditions: a flow of $CH_4$ in the range of about 15 to 40 sccm and a flow of $CHF_3$ in the range of about 50 to 100 sccm and a ratio of $CH_4$:$CHF_3$ in the range between about 3:10 to 6:10, and an argon flow rate of between about 300 to 400 sccm and a rf power in the range of about 450 to 550 W and at a pressure in the range of 300 to 600 mTorr and a wafer temperature between about 25° to 70° C. during the etch process.

14. The method of claim 1 wherein the substrate further comprises a first insulating layer of silicon oxide over the substrate surface and underlying said SOG layer, said first insulating layer having a thickness in the range of about 1000 to 3000 Å.

15. The method of claim 1 wherein a first insulation layer is formed on the substrate surface before said SOG layer is formed; and said etching back comprises etching all of said sacrificial layer and portions of said SOG layer and portions of said first insulation layer.

16. The method of claim 1 wherein said SOG layer is composed of a material selected from the group consisting of silicon oxide and silicon nitride.

17. The method of forming a planar surface by uniformly etching back a spin-on-glass (SOG) layer over a substrate comprising:
    (1) forming a first insulating layer over a substrate; said substrate having an annular shape with a central area and a peripheral area:
    (2) forming a SOG layer over said first insulating layer; said SOG layer having a greater thickness in said central area than in said peripheral area:
    (3) forming a sacrificial layer over said SOG layer; said sacrificial layer having a greater thickness in said peripheral area of said substrate compared to said central area; the total thickness of said sacrificial layer and said SOG layer is approximately equal in said central area and said periphery area: said sacrificial layer is formed of silicon oxide formed by a chemical vapor deposition process where reactant gas is flowed over said substrate and controlling the reactant gas velocity so that the reactant gas flow rate is greater over said peripheral area than said central area, and
    (4) etching back said sacrificial layer and portions of said SOG layer, the etch back having a selectivity of said SOG layer to said sacrificial layer of about 1:1.

18. The method of claim 17 wherein the SOG layer has a thickness in the range of about 3000 to 6000 Å.

19. The method of claim 17 wherein said spin-on-glass layer is formed by applying more than one spin-on-glass layer.

20. The method of claim 17 wherein said spin-on-glass layer is baked and cured before said sacrificial layer is formed.

21. The method of claim 17 wherein said spin-on-glass layer is composed of a material selected from the group consisting of silicate and siloxane.

22. The method of claim 17 wherein the sacrificial layer has a thickness in the range of about 3000 to 8000 Å.

23. The method of claim 17 wherein the sacrificial layer is formed of silicon oxide formed by a plasma enhanced chemical vapor deposition process by decomposing Tetra-ethyloxysilane (TEOS).

24. The method of claim 17 wherein the sacrificial layer is formed of silicon oxide formed by a plasma enhanced chemical vapor deposition process using silane.

25. The method of claim 17 wherein the etching back of said SOG layer is performed with a trifluoromethane ($CHF_3$), methane ($CH_4$) and oxygen etch plasma chemistry.

26. The method of claim 17 wherein said etch back of SOG layer is performed at about the following conditions: a flow of $CH_4$ in the range of about 15 to 40 sccm and a flow of $CHF_3$ in the range of about 50 to 100 sccm and a ratio of $CH_4$:$CHF_3$ in the range between about 3:10 to 6:10, and an argon flow rate of between about 300 to 400 sccm and a rf power in the range of about 450 to 550 W and at a pressure in the range of 300 to 600 mTorr and a wafer temperature between about 25° to 70° C. during the etch process.

27. The method of claim 17 wherein said first insulating layer has a thickness in the range of about 1000 to 3000 Å.

28. The method of claim 17 wherein the method further includes forming a second insulating layer over the remaining portions of said first insulating layer and said remaining SOG layer.

29. The method of claim 17 wherein said SOG layer is composed of a material selected from the group consisting of silicon oxide and silicon nitride.

30. The method of forming a planar surface by uniformly etching back a spin-on-glass (SOG) layer over a substrate comprising:
    (1) forming a first insulating layer composed of silicon oxide over a substrate: said substrate having an annular shape with a central area and a peripheral area:
    (2) forming a SOG layer over said first insulating layer; said SOG layer having a greater thickness in said central area than in said peripheral area: said SOG layer having a thickness in a range of between about 3000 and 8000 Å;
    (3) forming a sacrificial layer over said SOG layer; said sacrificial layer having a greater thickness in said peripheral area of said substrate compared to said central area; the total thickness of said sacrificial layer and said SOG layer is approximately equal in said central area and said periphery area; said sacrificial layer is formed of silicon oxide formed by a chemical vapor deposition process where reactant gas is flowed over said substrate and controlling the reactant gas velocity so that the reactant gas flow rate is greater over said peripheral area than said central area; said sacrificial layer having a thickness in a range of between about 3000 and 8000 Å; and
    (4) etching back said sacrificial layer and portions of said SOG layer using a reactive ion etch using $CHF_3$, $CH_4$ and $O_2$ gasses; the selectivity of the etch back of said SOG layer with respect to said sacrificial layer is approximately 1:1, wherein the etch back of said SOG layer is performed at about the following conditions: a flow of $CH_4$ in the range of about 15 to 40 sccm and a flow of $CHF_3$ in the range of about 50 to 100 sccm and a ratio of $CH_4$:$CHF_3$ in the range between about 3:10 to 6:10, and an argon flow rate of between about 300 to 400 sccm and a RF power in the range of about 450 to 550 W and at a pressure in the range of 300 to 600 mTorr and a wafer temperature between about 25° to 70° C. during the etch process.

31. The method of claim 30 wherein said SOG layer is formed by applying more than one spin-on-glass layer.

32. The method of claim 30 wherein said spin-on-glass layer is baked and cured before said sacrificial layer is formed.

33. The method of claim 30 wherein said spin-on-glass layer is composed of a material selected from the group consisting of silicate and siloxane.

34. The method of claim 30 wherein the sacrificial layer is formed of silicon oxide formed by a plasma enhanced chemical vapor deposition process by decomposing Tetraethyloxysilane (TEOS).

* * * * *